(12) United States Patent
Imai

(10) Patent No.: US 10,224,943 B2
(45) Date of Patent: Mar. 5, 2019

(54) ATOMIC OSCILLATOR

(71) Applicant: Seiko Epson Corporation, Tokyo (JP)

(72) Inventor: Yasutaka Imai, Suwa (JP)

(73) Assignee: Seiko Epson Corporation (JP)

( * ) Notice: Subject to any disclaimer, the term of this patent is extended or adjusted under 35 U.S.C. 154(b) by 155 days.

(21) Appl. No.: 15/289,311

(22) Filed: Oct. 10, 2016

(65) Prior Publication Data

US 2017/0117909 A1    Apr. 27, 2017

(30) Foreign Application Priority Data

Oct. 27, 2015  (JP) .................. 2015-210822

(51) Int. Cl.

| H03L 7/26 | (2006.01) |
|---|---|
| H01L 33/10 | (2010.01) |
| H01L 33/40 | (2010.01) |
| H01L 33/50 | (2010.01) |
| H01L 33/64 | (2010.01) |
| H01S 5/183 | (2006.01) |
| H01S 5/187 | (2006.01) |
| H01S 5/343 | (2006.01) |

(Continued)

(52) U.S. Cl.
CPC ............. *H03L 7/26* (2013.01); *H01L 33/10* (2013.01); *H01L 33/40* (2013.01); *H01L 33/50* (2013.01); *H01L 33/642* (2013.01); *H01S 5/0264* (2013.01); *H01S 5/183* (2013.01); *H01S 5/187* (2013.01); *H01S 5/18302* (2013.01); *H01S 5/18311* (2013.01); *H01S 5/34313* (2013.01); *H03L 1/04* (2013.01); *H01L 25/167* (2013.01); *H01L 27/15* (2013.01); *H01S 5/0425* (2013.01); *H01S 5/0683* (2013.01); *H01S 2301/176* (2013.01)

(58) Field of Classification Search
CPC ... H03L 7/26; H03L 1/04; H01S 5/183; H01S 5/068; H01S 5/187; H01S 5/34313; H01S 5/34386; H01L 33/64; H01L 33/50; H01L 33/10; H01L 33/40
USPC ............ 331/3, 94.1; 372/107, 92, 45.01, 99, 372/38.04, 27
See application file for complete search history.

(56) References Cited

U.S. PATENT DOCUMENTS

| 5,956,362 | A | * | 9/1999 | Yokogawa | ............. | B82Y 20/00 |
|---|---|---|---|---|---|---|
| | | | | | | 372/46.01 |
| 9,705,283 | B1 | * | 7/2017 | Deppe | ..................... | H01S 5/187 |

(Continued)

FOREIGN PATENT DOCUMENTS

JP   2015-062167 A   4/2015

*Primary Examiner* — Arnold Kinkead

(74) *Attorney, Agent, or Firm* — Harness, Dickey & Pierce, P.L.C.

(57) ABSTRACT

An atomic oscillator includes a gas cell housing alkali metal atoms, a light source providing light to the gas cell, and a light detector that detects an amount of light transmitted through the gas cell. The light source includes a substrate, a first mirror layer on an upper portion of the substrate, an active layer on an upper portion of the first mirror layer, a second mirror layer on an upper portion of the active layer, a first contact layer on an upper portion of the second mirror layer, a light absorption layer on an upper portion of the first contact layer, and a second contact layer on an upper portion of the light absorption layer. As such, an output wavelength and the light output of the light source can be independently adjusted.

7 Claims, 14 Drawing Sheets

(51) Int. Cl.
*H03L 1/04* (2006.01)
*H01S 5/026* (2006.01)
H01S 5/042 (2006.01)
H01S 5/0683 (2006.01)
H01L 25/16 (2006.01)
H01L 27/15 (2006.01)

(56) References Cited

U.S. PATENT DOCUMENTS

| | | | |
|---|---|---|---|
| 2002/0030198 A1* | 3/2002 | Coman | B82Y 20/00 257/103 |
| 2003/0087121 A1* | 5/2003 | Domash | G02B 6/29358 428/641 |
| 2015/0054591 A1 | 2/2015 | Adachi et al. | |

* cited by examiner

ATOMIC OSCILLATOR

BACKGROUND

1. Technical Field

The present invention relates to an atomic oscillator.

2. Related Art

An atomic oscillator using transition energy of an atom as a reference frequency has been widely used in a communication base station or the like as one of oscillators having the highest accuracy. There are several types of atomic oscillators, and a microwave double resonance type atomic oscillator using a rubidium (Rb) lamp has been most generally used.

Recently, an atomic oscillator using a phenomenon referred to as coherent population trapping (CPT) which is one of quantum interference effects has been proposed (for example, refer to JP-A-2015-62167), and a reduction in the size of the atomic oscillator and a reduction in the power consumption are expected, compared to the related art. In a case of a CPT type atomic oscillator, a coherent light source such as laser is used in a light source, and high frequency signals are superimposed, and thus, the side band thereof is used in the exhibition of the CPT phenomenon. The CPT type atomic oscillator is an oscillator using an electromagnetically induced transparency (EIT) phenomenon in which absorption of coherent light stops in a case where an alkali metal atom is irradiated with coherent light rays having two types of different wavelengths (frequencies).

In order to exhibit the CPT phenomenon as the light source of the atomic oscillator, high accurate adjustment of an output wavelength of a laser element or the like is necessary. In a case where an injection current with respect to the laser element or the like is changed, it is possible to adjust the output wavelength.

However, in a case where the injection current with respect to the laser element is changed, a light output of the laser element or the like is simultaneously changed, and thus, it is necessary to form a control loop of the atomic oscillator in consideration of this circumstance, and complicated control is necessary.

SUMMARY

An advantage of some aspects of the invention is to provide an atomic oscillator in which an output wavelength and a light output of a light source are able to be independently adjusted, and control is easily performed.

An atomic oscillator according to an aspect of the invention includes a gas cell sealing alkali metal atoms; a light source emitting light to the gas cell; and a light detection unit detecting a light amount of light transmitted through the gas cell, in which the light source includes, a substrate, a first mirror layer disposed on an upper portion of the substrate, an active layer disposed on an upper portion of the first mirror layer, a second mirror layer disposed on an upper portion of the active layer, a first contact layer disposed on an upper portion of the second mirror layer, a light absorption layer disposed on an upper portion of the first contact layer, and a second contact layer disposed on an upper portion of the light absorption layer.

In such an atomic oscillator, in a case where a center wavelength of light exiting from the light source is changed by changing a current amount injected into the active layer, it is possible to return a light output of the light exiting from the light source to a predetermined value by changing a voltage applied to the light absorption layer even in a case where the light output (the light amount) of the light exiting from the light source is shifted from the predetermined value. Thus, in the atomic oscillator, an output wavelength (the center wavelength) and the light output of the light source are able to be independently adjusted, and control is easily performed.

In the description according to the invention, in a case where a term of "upper portion", for example, is used in a sentence such as "one specific thing (hereinafter, referred to as "B") is formed on an "upper portion" of the other specific thing (hereinafter, referred to as "A")", the "upper portion" is used as a term including a case of directly forming B on A and a case of forming B on A through other things.

In the atomic oscillator according to the aspect of the invention, a heat insulating layer having thermal conductivity lower than that of the second mirror layer may be provided between the second mirror layer and the first contact layer.

In such an atomic oscillator, even in a case where the light absorption layer absorbs light and generates heat, it is possible to prevent the heat from reaching the second mirror layer or the active layer by the heat insulating layer.

In the atomic oscillator according to the aspect of the invention, an area of the heat insulating layer may be smaller than an area of the first contact layer when seen from a lamination direction of the active layer and the first mirror layer.

In such an atomic oscillator, even in a case where the light absorption layer absorbs light and generates heat, it is possible to prevent the heat from reaching the second mirror layer or the active layer by the heat insulating layer and a space between the second mirror layer and the first contact layer.

In the atomic oscillator according to the aspect of the invention, a layer having thermal conductivity lower than that of the heat insulating layer may be provided around the heat insulating layer.

In such an atomic oscillator, it is possible to improve impact resistance, compared to a case where a space is provided between the second mirror layer and the first contact layer.

In the atomic oscillator according to the aspect of the invention, a heat diffusion layer having thermal conductivity higher than that of the second mirror layer may be provided between the second mirror layer and the first contact layer.

In such an atomic oscillator, even in a case where the light absorption layer absorbs light and generates heat, it is possible to diffuse the heat to the outside through the heat diffusion layer, and it is possible to prevent the heat from reaching the second mirror layer or the active layer.

In the atomic oscillator according to the aspect of the invention, a control unit changing an output and a wavelength of light exiting from the light source by controlling a current injected into the active layer and changing a light absorption amount in the light absorption layer by controlling a voltage applied to the light absorption layer may be further included.

In such an atomic oscillator, it is possible to independently control an output wavelength and a light output of the light source by the control unit.

In the atomic oscillator according to the aspect of the invention, the control unit may control the voltage applied to the light absorption layer such that the output of the light exiting from the light source becomes constant.

In such an atomic oscillator, the control unit is able to change, for example, the light absorption amount in the light absorption layer, and is able to set the output of the light exiting from the light source to be constant.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail by using the drawings. Furthermore, the embodiments described below do not unfairly limit the contents of the invention described in the appended claims. In addition, all configurations described below are not limited to essential configuration requirements of the invention.

Figure 1:
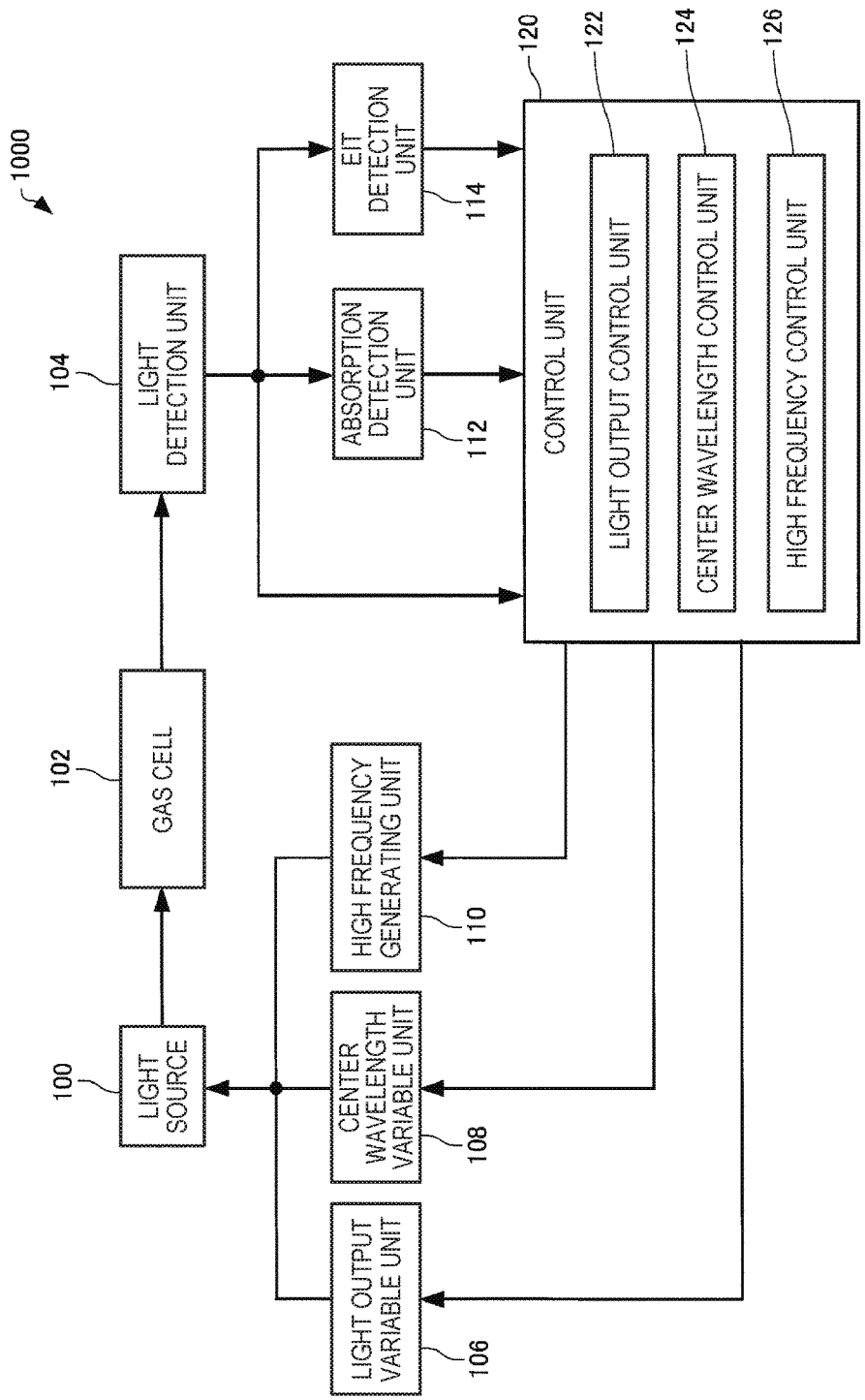
FIG. 1 is a functional block diagram of an atomic oscillator according to this embodiment.

1. Atomic Oscillator
1.1. Configuration
First, an atomic oscillator according to this embodiment will be described with reference to the drawings. FIG. 1 is a functional block diagram of an atomic oscillator 1000 according to this embodiment.

As illustrated in FIG. 1, the atomic oscillator 1000 includes a light source 100, a gas cell 102, a light detection unit 104, a light output variable unit 106, a center wavelength variable unit 108, a high frequency generating unit 110, an absorption detection unit 112, an EIT detection unit 114, and a control unit 120. The control unit 120 includes a light output control unit 122, a center wavelength control unit 124, and a high frequency control unit 126. The atomic oscillator 1000 allows an EIT phenomenon to occur in an alkali metal atom by a resonance light pair (first light and second light) containing two different frequency components.

The light source 100 generates the first light and the second light having frequencies different from each other, and irradiates the alkali metal atom sealed in the gas cell 102 with the light. The detailed configuration of the light source 100 will be described below.

Figure 2:
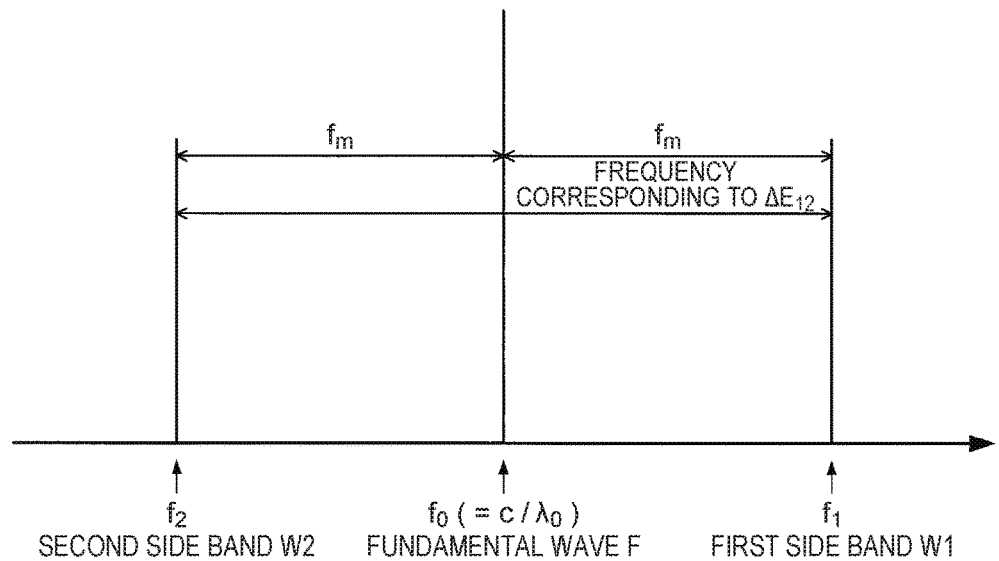
FIG. 2 is a diagram illustrating a frequency spectrum of resonance light.
Figure 3:
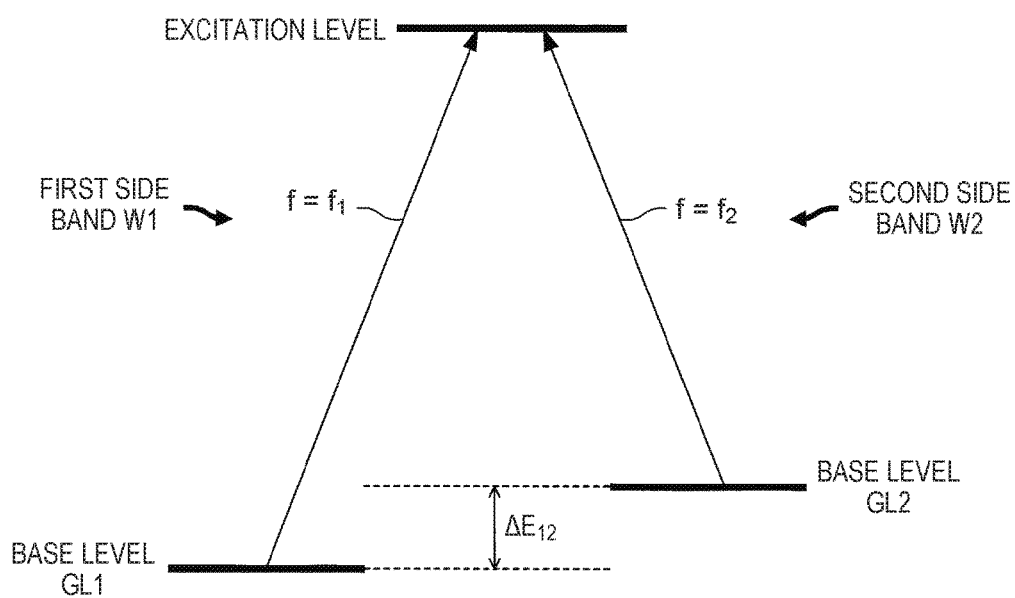
FIG. 3 is a diagram illustrating a relationship between a Λ type 3-level model of an alkali metal atom, and a first side band and a second side band.

Here, FIG. 2 is a diagram illustrating a frequency spectrum of resonance light. FIG. 3 is a diagram illustrating a relationship between a Λ type 3-level model of the alkali metal atom, and a first side band (the first light) W1 and a second side band (the second light) W2. Light L exiting from the light source 100 includes a fundamental wave F having a center frequency $f_0$ (=$c/\Lambda_0$:c is the speed of light, and $\Lambda_0$ is the center wavelength of laser light), the first side band W1 having a frequency $f_1$ in an upper side band with respect to the center frequency $f_0$, and the second side band W2 having a frequency $f_2$ in a lower side band with respect to the center frequency $f_0$, illustrated in FIG. 2. The frequency $f_1$ of the first side band W1 is $f_1=f_0+f_m$, and the frequency $f_2$ of the second side band W2 is $f_2=f_0-f_m$.

As illustrated in FIG. 3, a frequency difference between the frequency $f_1$ of the first side band W1 and the frequency $f_2$ of the second side band W2 is coincident with a frequency corresponding to an energy difference $\Delta E_{12}$ between a base level GL1 and a base level GL2 of the alkali metal atom. Therefore, the alkali metal atom allows the EIT phenomenon to occur by the first side band W1 having the frequency $f_1$ and the second side band W2 having the frequency $f_2$.

Here, the EIT phenomenon will be described. It has been known that a mutual interaction between the alkali metal atom and the light is able to be described by a Λ type 3-level model. As illustrated in FIG. 3, the alkali metal atom has two base levels, and in a case where the alkali metal atom is independently irradiated with each of the first side band W1 having a wavelength (the frequency $f_1$) corresponding to an energy difference between the base level GL1 and an excitation level and the second side band W2 having a wavelength (the frequency $f_2$) corresponding to an energy difference between the base level GL2 and the excitation level, light absorption occurs. Here, as illustrated in FIG. 2, in a case where the alkali metal atom is simultaneously irradiated with the first side band W1 and the second side band W2 in which a frequency difference $f_1-f_2$ is accurately coincident with the frequency corresponding to the energy difference $\Delta E_{12}$ between the base level GL1 and the base level GL2, a state in which two base levels are superposed, that is, a quantum interference state is formed, and excitation to the excitation level stops, and thus, a transparency phenomenon (the EIT phenomenon) occurs in which the first side band W1 and the second side band W2 permeate the alkali metal atom. A steep change in a light absorption behavior when the frequency difference $f_1-f_2$ between the first side band W1 and the second side band W2 is shifted from the frequency corresponding to the energy difference $\Delta E_{12}$ between the base level GL1 and the base level GL2 is detected and controlled by using the EIT phenomenon, and thus, an oscillator with high accuracy is able to be manufactured.

In the gas cell 102, gaseous alkali metal atoms (a sodium atom, a rubidium atom, a cesium atom, and the like) are sealed in a container. The cesium atom, for example, becomes gas by being heated to approximately 80° C. In a case where the gas cell 102 is irradiated with two light waves (the first light and the second light) having the frequency (the wavelength) corresponding to the energy difference between the two base levels of the alkali metal atom, the alkali metal atom allows the EIT phenomenon to occur. For example, in a case where the alkali metal atom is a cesium atom, the frequency corresponding to the energy difference between the base level GL1 and the base level GL2 on a D1 line becomes 9.19263 . . . GHz, and thus, in a case where the cesium atom is irradiated with two light waves in which the frequency difference is 9.1926 . . . GHz, the EIT phenomenon occurs.

The light detection unit 104 detects the amount (intensity) of light which is transmitted through the gas cell 102 (which is transmitted through the alkali metal atom sealed in the gas cell 102). The light detection unit 104 outputs a detection signal according to the amount of light which is transmitted through the alkali metal atom. For example, a photodiode is used as the light detection unit 104.

The light output variable unit 106 applies a voltage between electrodes 60 and 62 of the light source 100 (refer to FIG. 5 described below) on the basis of a signal from the light output control unit 122, and changes a light output (a light amount) of the light source 100. The light output variable unit 106 may be configured by including a power source 4 (refer to FIG. 8 described below) which applies a voltage between the electrodes 60 and 62.

The center wavelength variable unit 108 injects a current into an active layer 22 by applying a voltage between electrodes 30 and 32 of the light source 100 (refer to FIG. 5) on the basis of the signal from the center wavelength control unit 124, and changes the center wavelength of the light L exiting from the light source 100. Accordingly, it is possible to change the center wavelength of the resonance light pair (the first light and the second light) included in the light L. The center wavelength variable unit 108 may be configured by including a power source 2 (refer to FIG. 8) which applies a voltage between the electrodes 30 and 32.

The high frequency generating unit 110 generates the resonance light pair by supplying a high frequency signal between the electrodes 30 and 32 of the light source 100 on the basis of the signal from the high frequency control unit 126. The high frequency generating unit 110 may be realized by a dedicated circuit.

The absorption detection unit 112, for example, detects the minimum value (the bottom of the absorption) of a signal intensity of the detection signal output from the light detection unit 104 at the time of changing the center wavelength of the light L. The absorption detection unit 112 may be realized by a dedicated circuit.

The EIT detection unit 114 detects the EIT phenomenon by synchronously detecting the detection signal output from the light detection unit 104. The EIT detection unit 114 may be realized by a dedicated circuit.

The light output control unit 122 controls the light output variable unit 106 on the basis of the average (a DC component) of the light amount of the detection signal output from the light detection unit 104, and thus, controls a voltage which is applied to the light absorption layer 52 of the light source 100 (refer to FIG. 5), and a light absorption amount in the light absorption layer 52 is changed. Accordingly, the light output control unit 122 is able to change the light output (the light amount) of the light source 100. The light output control unit 122 may control the light output variable unit 106 on the basis of the moving average of the light amount of the detection signal. The light output control unit 122 controls the voltage which is applied to the light absorption layer 52 such that the light output exiting from the light source 100 becomes constant (for example, such that the DC component of the detection signal which is output from the light detection unit 104 becomes constant). The light output control unit 122 may be configured by including an auto power control (APC) circuit.

The center wavelength control unit 124 controls the current which is injected into the active layer 22 of the light source 100 (refer to FIG. 5) by controlling the center wavelength variable unit 108 on the basis of the signal from the absorption detection unit 112, and changes the light output (the light amount) and the wavelength (the center wavelength) of the light L exiting from the light source 100.

The high frequency control unit 126 inputs a signal generating a high frequency signal into the high frequency generating unit 110 on the basis of the signal from the EIT detection unit 114.

Furthermore, the control unit 120 may be configured to perform the control described above by being realized by a dedicated circuit. In addition, the control unit 120, for example, maybe configured to function as a computer by allowing a central processing unit (CPU) to execute a control program which is stored in a storage device such as a read only memory (ROM) or a random access memory (RAM) and to perform the control described below.

Next, the operation of the atomic oscillator 1000 will be described. First, an initial operation at the time of activating the atomic oscillator 1000 in a stop state will be described.

The high frequency control unit 126 inputs the signal into the high frequency generating unit 110, and inputs the high frequency signal into the light source 100 from the high frequency generating unit 110. At this time, the frequency of the high frequency signal is slightly shifted such that the EIT phenomenon does not occur. For example, in a case where cesium is used as the alkali metal atom of the gas cell 102, the frequency is shifted from a value of 4.596 . . . GHz.

Next, the center wavelength control unit 124 controls the center wavelength variable unit 108, and sweeps the center wavelength of the light L. At this time, the frequency of the high frequency signal is set such that the EIT phenomenon does not occur, and thus, the EIT phenomenon does not occur. The absorption detection unit 112 detects the minimum value (the bottom of the absorption) of the intensity of the detection signal output in the light detection unit 104 at the time of sweeping the center wavelength of the light L. In the absorption detection unit 112, for example, a portion, in which an intensity change in the detection signal with respect to the center wavelength of the light L becomes constant, is set to the bottom of the absorption.

In a case where the absorption detection unit 112 detects the bottom of the absorption, the center wavelength control unit 124 controls the center wavelength variable unit 108, and fixes (locks) the center wavelength. That is, the center wavelength control unit 124 fixes the center wavelength of the light L to a wavelength corresponding to the bottom of the absorption.

Next, the light output control unit 122 controls the light output variable unit 106 on the basis of the DC component of the detection signal output from the light detection unit 104, and changes the light output of the light source 100. Specifically, the light output control unit 122 changes the light output of the light source 100 such that the DC component of the detection signal becomes a predetermined value.

Next, the high frequency control unit 126 controls the high frequency generating unit 110, and matches the frequency of the high frequency signal to a frequency in which the EIT phenomenon is generated. After that, the operation proceeds to a loop operation, and an EIT signal is detected by the EIT detection unit 114.

Next, the loop operation of the atomic oscillator 1000 will be described.

The EIT detection unit 114 synchronously detects the detection signal output from the light detection unit 104, and the high frequency control unit 126 performs control such that the frequency of the high frequency signal which is generated by the high frequency generating unit 110 becomes a frequency corresponding to half of $\Delta E_{12}$ of the alkali metal atom of the gas cell 102, on the basis of the signal which is input from the EIT detection unit 114.

The absorption detection unit 112 synchronously detects the detection signal which is output from the light detection unit 104, and the center wavelength control unit 124 controls the center wavelength variable unit 108 such that the center wavelength of the light L becomes the wavelength corresponding to the minimum value (the bottom of the absorption) of the intensity of the detection signal output in the light detection unit 104, on the basis of the signal which is input from the absorption detection unit 112.

The light output control unit 122 controls the light output variable unit 106 on the basis of the DC component of the detection signal which is output from the light detection unit 104. Specifically, in a case where the DC component of the detection signal becomes smaller than a predetermined value, the light output control unit 122 controls the light output variable unit 106 such that the DC component of the detection signal becomes the predetermined value. Even in a case where the center wavelength of the light L is shifted from the wavelength corresponding to the bottom of the absorption according to the control of the light output control unit 122, it is possible to match the center wavelength of the light L to the wavelength corresponding to the bottom of the absorption according to the control of the center wavelength control unit 124 described above. Further, even in a case where the DC component of the detection signal is shifted from a predetermined value according to the control of the center wavelength control unit 124, it is possible to return the DC component of the detection signal to the predetermined value according to the control of the light output control unit 122 described above.

Furthermore, in the atomic oscillator 1000, control may be performed such that a temperature (a driving temperature) of the light source 100 becomes constant.

1.2. Light Source

Figure 4:
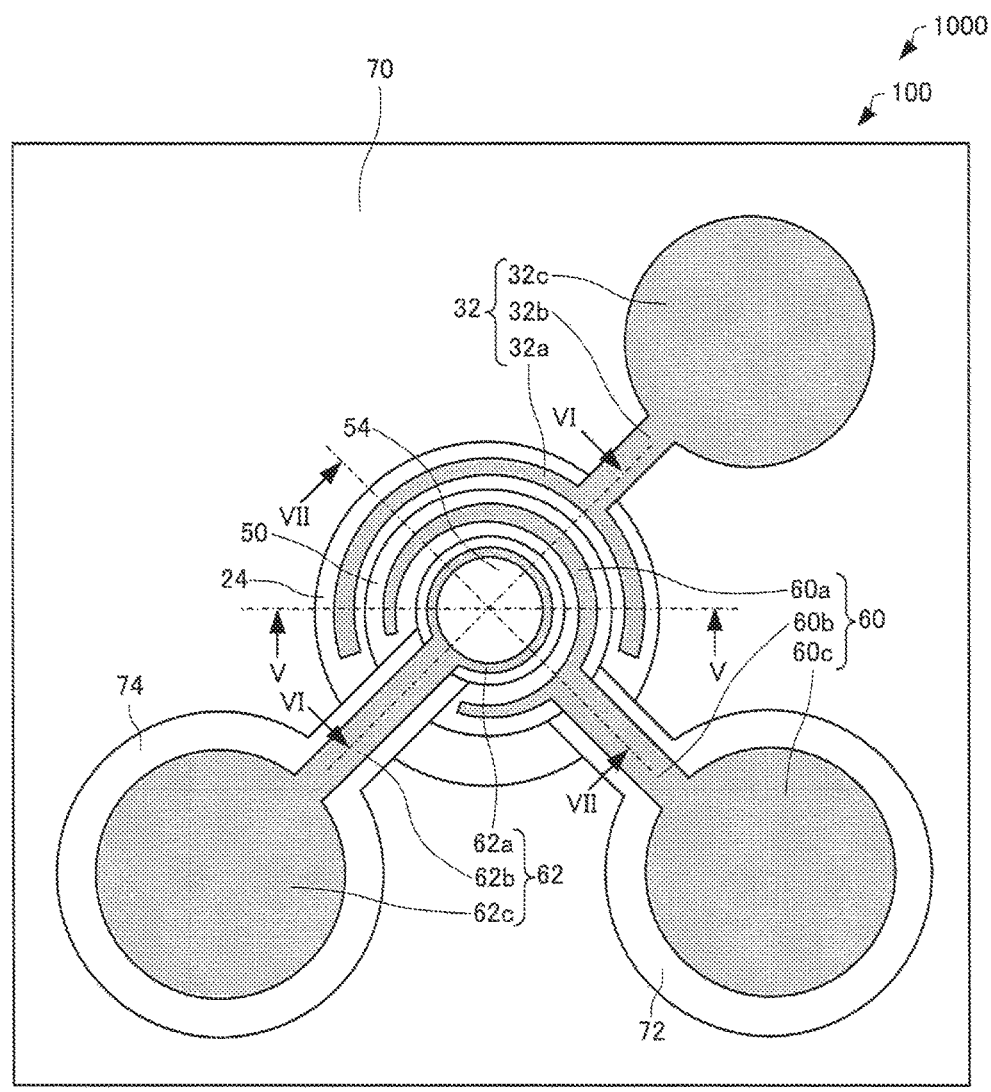
FIG. 4 is a plan view schematically illustrating a light source of the atomic oscillator according to this embodiment.
Figure 5:
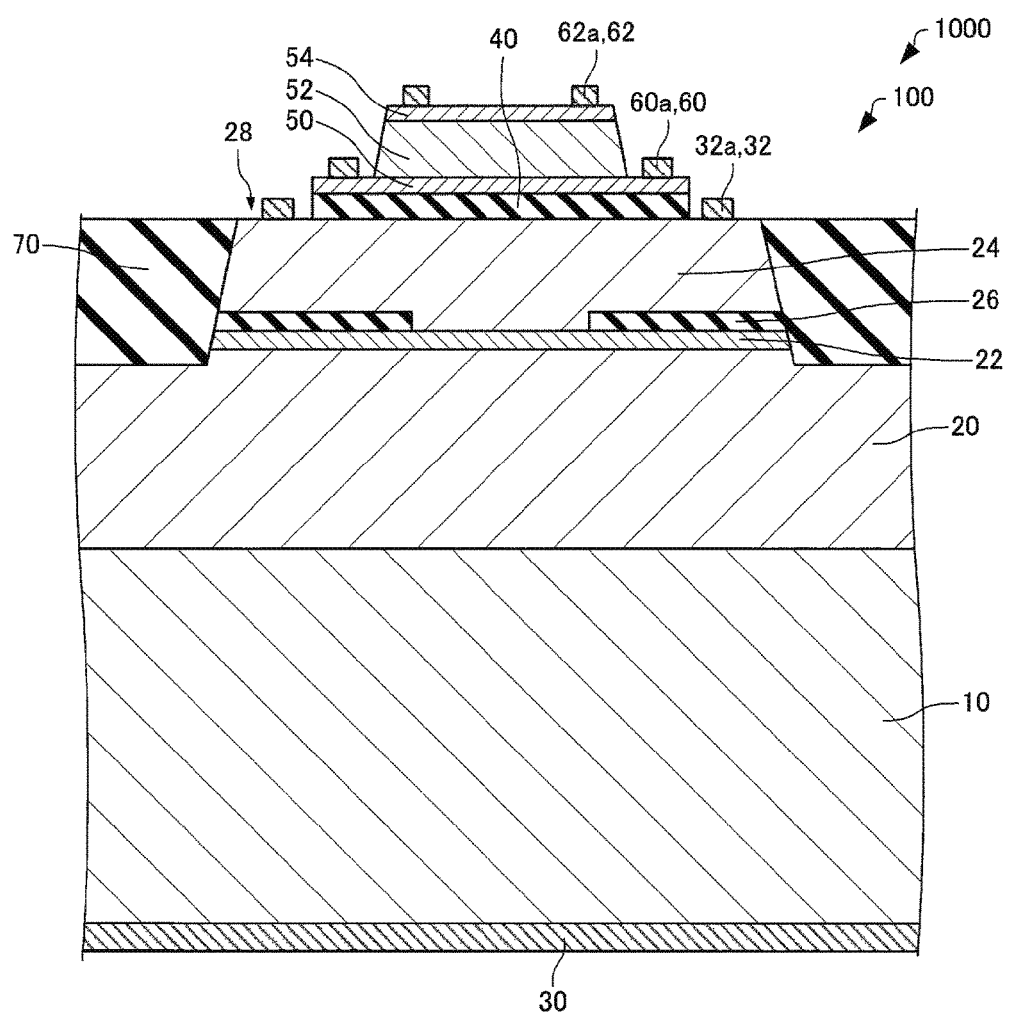
FIG. 5 is a sectional view schematically illustrating the light source of the atomic oscillator according to this embodiment.
Figure 6:
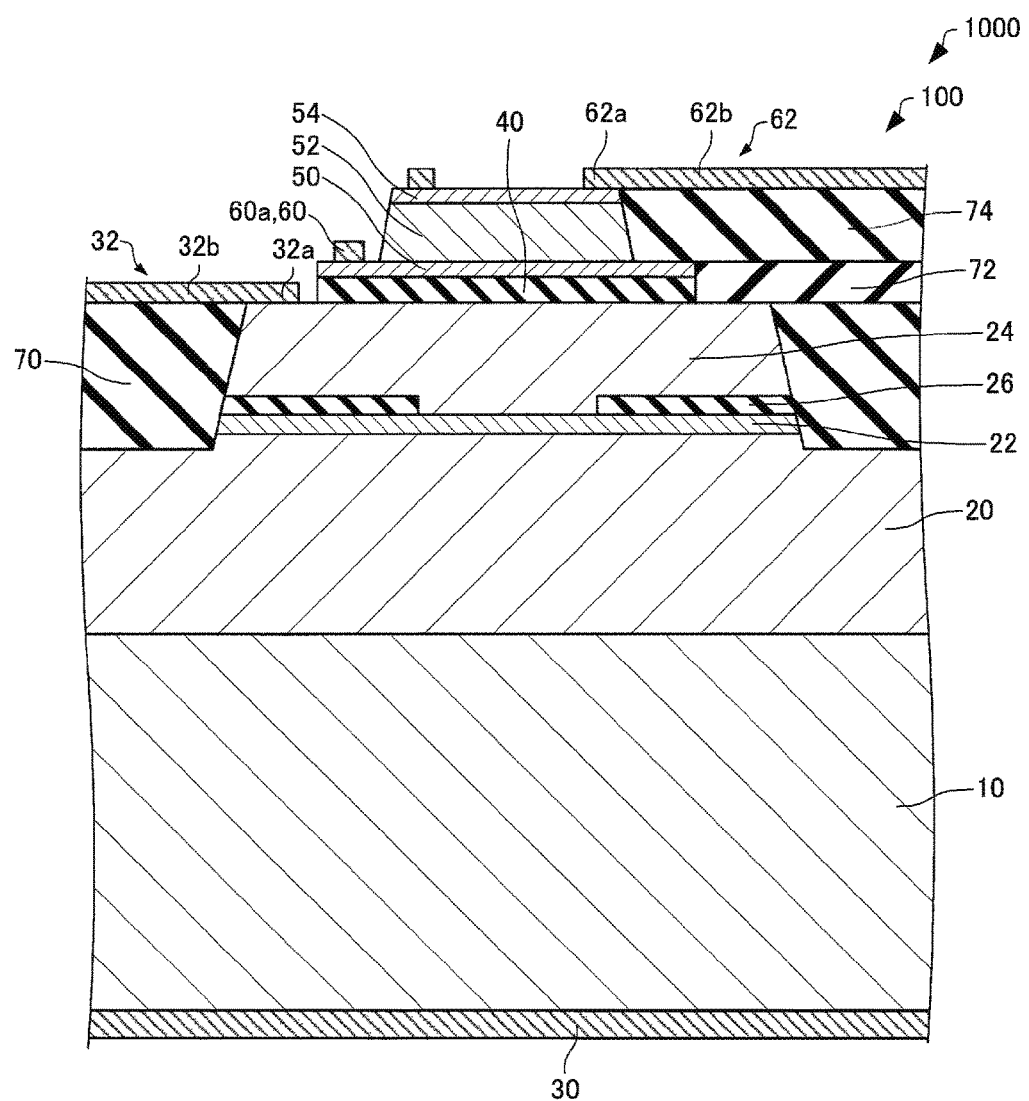
FIG. 6 is a sectional view schematically illustrating the light source of the atomic oscillator according to this embodiment.
Figure 7:
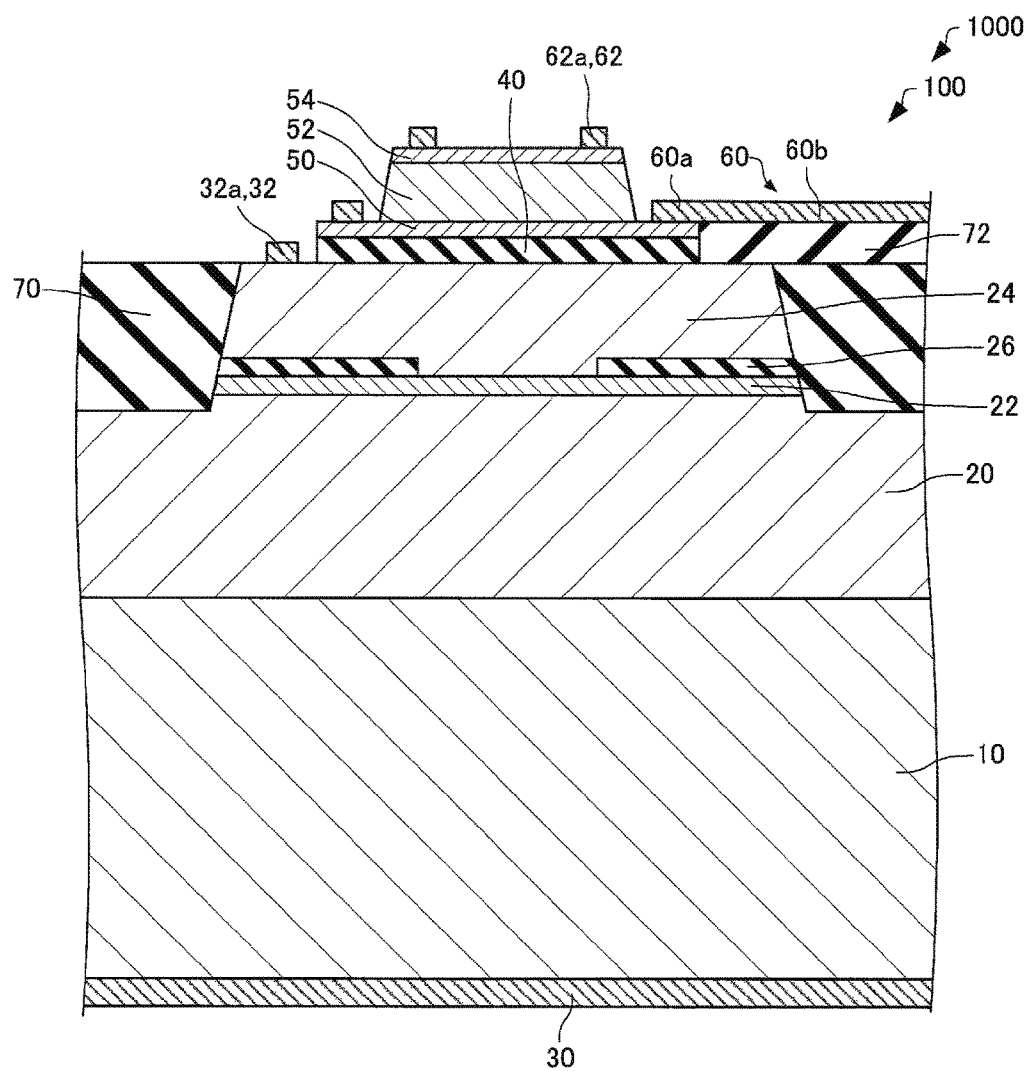
FIG. 7 is a sectional view schematically illustrating the light source of the atomic oscillator according to this embodiment.
Figure 8:
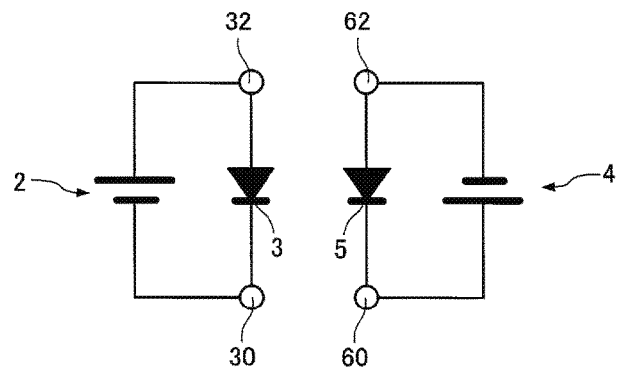
FIG. 8 is a circuit diagram for illustrating the light source of the atomic oscillator according to this embodiment.

Next, the light source 100 of the atomic oscillator 1000 according to this embodiment will be described with reference to the drawings. FIG. 4 is a plan view schematically illustrating the light source 100 according to this embodiment. FIG. 5 is a sectional view of line V-V of FIG. 4 schematically illustrating the light source 100 according to this embodiment. FIG. 6 is a sectional view of line VI-VI of FIG. 4 schematically illustrating the light source 100 according to this embodiment. FIG. 7 is a sectional view of line VII-VII of FIG. 4 schematically illustrating the light source 100 according to this embodiment. FIG. 8 is a circuit diagram for illustrating the light source 100 according to this embodiment.

As illustrated in FIG. 4 to FIG. 7, the light source 100 includes a substrate 10, a first mirror layer 20, the active layer 22, a second mirror layer 24, a current constriction layer 26, the first electrode 30, the second electrode 32, a heat insulating layer 40, a first contact layer 50, a light absorption layer 52, a second contact layer 54, the third electrode 60, the fourth electrode 62, and insulating layers 70, 72, and 74.

The substrate 10, for example, is a first conductive (for example, n type) GaAs substrate.

The first mirror layer 20 is disposed on the substrate 10. The first mirror layer 20 is a first conductive semiconductor layer. The first mirror layer 20 is a distribution Bragg reflective (DBR) mirror in which a high refractive index layer and a low refractive index layer having a refractive index lower than that of the high refractive index layer are alternately laminated. The high refractive index layer, for example, is an n type $Al_{0.12}Ga_{0.88}As$ layer. The low refractive index layer, for example, is an n type $Al_{0.9}Ga_{0.1}As$ layer. The number of laminations (the number of pairs) of the high refractive index layer and the low refractive index layer, for example, is greater than or equal to 10 pairs and less than or equal to 50 pairs, and is specifically 40.5 pairs.

The active layer 22 is disposed on the first mirror layer 20. The active layer 22, for example, has a multiple quantum well (MQW) structure in which three quantum well structures configured of an i type $In_{0.06}Ga_{0.94}As$ layer and an i type $Al_{0.3}Ga_{0.7}As$ layer are superposed.

The second mirror layer 24 is disposed on the active layer 22. The second mirror layer 24 is a second conductive (for example, p type) semiconductor layer. The second mirror layer 24 is a distribution Bragg reflective (DBR) mirror in which a high refractive index layer and a low refractive index layer having a refractive index lower than that of the high refractive index layer are alternately laminated. The high refractive index layer, for example, is a p type $Al_{0.12}Ga_{0.88}As$ layer. The low refractive index layer, for example, is a p type AlGaAs layer. The number of laminations (the number of pairs) of the high refractive index layer and the low refractive index layer, for example, is greater than or equal to 3 pairs and less than or equal to 40 pairs, and is specifically 20 pairs.

The second mirror layer 24, the active layer 22, and the first mirror layer 20 configure a vertical resonator type pin diode. As illustrated in FIG. 8, in a case where a voltage is applied between the electrodes 30 and 32 which are electrically connected to the power source 2 in a forward direction of a pin diode 3, an electron is rebonded to a hole in the active layer 22, and thus, light emission is performed. The light generated in the active layer 22 reciprocates (is multiply reflected) between the first mirror layer 20 and the second mirror layer 24, and at this time, induced emission occurs, and thus, intensity is amplified. Then, in a case where an optical gain is greater than an optical loss, laser oscillation occurs, and laser light exits from an upper surface of the second contact layer 54 in a vertical direction (in a lamination direction of the active layer 22 and the first mirror layer 20). The wavelength of the laser light, for example, is greater than or equal to 800 nm and less than or equal to 950 nm, and is specifically 852 nm or 895 nm.

The current constriction layer 26 is provided between the first mirror layer 20 and the second mirror layer 24. In an example illustrated in FIG. 5, the current constriction layer 26 is provided on the active layer 22. The current constriction layer 26 is an insulating layer in which an opening portion is formed, and the second mirror layer 24 is provided on the opening portion.

The planar shape of the current constriction layer 26 (the shape seen from the lamination direction of the active layer 22 and the first mirror layer 20) is a ring-like shape. The current constriction layer 26 is able to prevent a current which is injected into the vertical resonator by the electrodes 30 and 32 from spreading into a planar direction (a direction orthogonal to the lamination direction of the active layer 22 and the first mirror layer 20).

The current constriction layer 26, the second mirror layer 24, the active layer 22, and the first mirror layer 20 configure a cylindrical portion 28. The planar shape of the cylindrical portion 28, for example, is a circular shape.

The first electrode 30 is disposed under the substrate 10. The first electrode 30, for example, is provided on a lower surface of a layer which is in ohmic contact with the first electrode 30 (in the example illustrated in FIG. 5, the substrate 10). The first electrode 30 is electrically connected to the first mirror layer 20. For example, an electrode, in which a Cr layer, an AuGe layer, an Ni layer, and an Au layer are laminated in this order from the substrate 10 side, is used as the first electrode 30. The first electrode 30 is one electrode for injecting a current into the active layer 22.

The second electrode 32 is disposed on the second mirror layer 24. The second electrode 32 is electrically connected to the second mirror layer 24. For example, an electrode, in which a Cr layer, a Pt layer, a Ti layer, a Pt layer, and an Au layer are laminated in this order from the second mirror layer 24 side, is used as the second electrode 32. The second electrode 32 is the other electrode for injecting a current into the active layer 22.

As illustrated in FIG. 4, the second electrode 32 includes a contact portion 32a, a drawing portion 32b, and a pad portion 32c. The contact portion 32a is in contact with the second mirror layer 24. In an example illustrated in FIG. 4, the contact portion 32a has a shape in which a part of a ring is cut in plan view (when seen from the lamination direction of the active layer 22 and the first mirror layer 20), and is provided to surround the first contact layer 50. The planar shape of the drawing portion 32b, for example, is a linear shape. The drawing portion 32b connects the contact portion 32a to the pad portion 32c. The drawing portion 32b and the pad portion 32c are provided on the insulating layer 70. The pad portion 32c is connected to external wiring or the like as an electrode pad. In the illustrated example, the planar shape of the pad portion 32c is a circular shape. Furthermore, the insulating layer 70, for example, is in contact with a side surface of the cylindrical portion 28, and is provided to surround the cylindrical portion 28. The insulating layer 70, for example, is a polyimide layer and a silicon oxide layer.

The second electrode 32, the second mirror layer 24, the active layer 22, the first mirror layer 20, and the first electrode 30 configure a surface emission laser (vertical cavity surface emitting laser (VCSEL)).

The heat insulating layer 40 is disposed on the second mirror layer 24. The heat insulating layer 40 is provided between the second mirror layer 24 and the first contact layer 50. The heat insulating layer 40, for example, electrically separates the second mirror layer 24 from the first contact layer 50. In the illustrated example, the planar shape of the heat insulating layer 40 is a circular shape. An area of the heat insulating layer 40, for example, is smaller than an area of an upper surface of the second mirror layer 24, and the heat insulating layer 40 is provided on the inside of an outer circumference of the second mirror layer 24. Thermal conductivity of the heat insulating layer 40 is lower than thermal conductivity of the second mirror layer 24. Specifically, the thermal conductivity of the heat insulating layer 40 is lower than thermal conductivity of the high refractive index layer which configures the second mirror layer 24, and is lower than thermal conductivity of the low refractive index layer which configures the second mirror layer 24. The heat insulating layer 40, for example, is an aluminum oxide layer (an $Al_xO_y$ layer). For example, thermal conductivity of $Al_2O_3$ is 0.3 W/(cm·K).

The first contact layer 50 is disposed on the heat insulating layer 40. In the example illustrated in FIG. 4, the planar shape of the first contact layer 50 is a circular shape. In plan view, an area of the first contact layer 50 and the area of the heat insulating layer 40, for example, are identical to each other. The first contact layer 50, for example, is an n type GaAs layer.

The light absorption layer 52 is disposed on the first contact layer 50. In plan view, an area of the light absorption layer 52 is smaller than the area of the first contact layer 50, and the light absorption layer 52 is provided on the inside of an outer circumference of the first contact layer 50. The light absorption layer 52, for example, is an i type GaAs layer.

The second contact layer 54 is disposed on the light absorption layer 52. In the example illustrated in FIG. 4, the planar shape of the second contact layer 54 is a circular shape. A material of the second contact layer 54, for example, is a p type GaAs layer.

The second contact layer 54, the light absorption layer 52, and the first contact layer 50 configure a pin diode (a pin photodiode). As illustrated in FIG. 8, in a case where a voltage is applied between the electrodes 60 and 62 which are electrically connected to the power source 4 in a reverse direction of a pin diode 5, it is possible to absorb light in the light absorption layer 52. Accordingly, light generated in the active layer 22 (laser light generated in the surface emission laser) is absorbed. It is possible to adjust a light absorption amount in the light absorption layer 52 according to the size of a voltage which is applied to the light absorption layer 52.

Furthermore, a pin photodiode which is configured by including the light absorption layer 52 and the contact layers 50 and 54 may or may not extract a light current due to an electron and a hole which are excited by absorbing light in the light absorption layer 52 to an external circuit as a signal.

The third electrode 60 is disposed on the first contact layer 50. The third electrode 60, for example, is in ohmic contact with the first contact layer 50. A material of the third electrode 60, for example, is identical to a material of the first electrode 30. The third electrode 60 is one electrode for applying a voltage to the light absorption layer 52.

As illustrated in FIG. 4, the third electrode 60 includes a contact portion 60a, a drawing portion 60b, and a pad portion 60c. The contact portion 60a is in contact with the first contact layer 50. In the example illustrated in FIG. 4, the contact portion 60a has a shape in which a part of a ring is cut in plan view, and is provided to surround the second contact layer 54. The planar shape of the drawing portion 60b, for example, is a linear shape. The drawing portion 60b is connected to the contact portion 60a and the pad portion 60c. The drawing portion 60b and the pad portion 60c are provided on the insulating layer 72. The pad portion 60c is connected to external wiring or the like as an electrode pad. In the illustrated example, the planar shape of the pad portion 60c is a circular shape. Furthermore, as illustrated in FIG. 7, the insulating layer 72 is provided on the insulating layer 70 by being in contact with the side surface of the heat insulating layer 40 and the first contact layer 50. A material of the insulating layer 72, for example, is identical to a material of the insulating layer 70.

The fourth electrode 62 is disposed on the second contact layer 54. The fourth electrode 62, for example, is in ohmic contact with the second contact layer 54. A material of the fourth electrode 62, for example, is identical to a material of the second electrode 32. The fourth electrode 62 is the other electrode for applying a voltage to the light absorption layer 52.

As illustrated in FIG. 4, the fourth electrode 62 includes a contact portion 62a, a drawing portion 62b, and a pad portion 62c. The contact portion 62a is in contact with the second contact layer 54. In the example illustrated in FIG. 4, the planar shape of the contact portion 62a is a ring-like shape. The planar shape of the drawing portion 62b, for example, is a linear shape. The drawing portion 62b is in connect with the contact portion 62a and the pad portion 62c. The drawing portion 62b and the pad portion 62c are provided on the insulating layer 74. The pad portion 62c is connected to external wiring or the like as an electrode pad. In the illustrated example, the planar shape of the pad portion 62c is a circular shape. In plan view, areas of the pad portions 32c, 60c, and 62c, for example, are identical to each other. Furthermore, as illustrated in FIG. 6, the insulating layer 74 is provided on the insulating layer 72 by being in contact with the side surface of the light absorption layer 52 and the second contact layer 54. A material of the insulating layer 74, for example, is identical to the material of the insulating layer 70.

Figure 9:
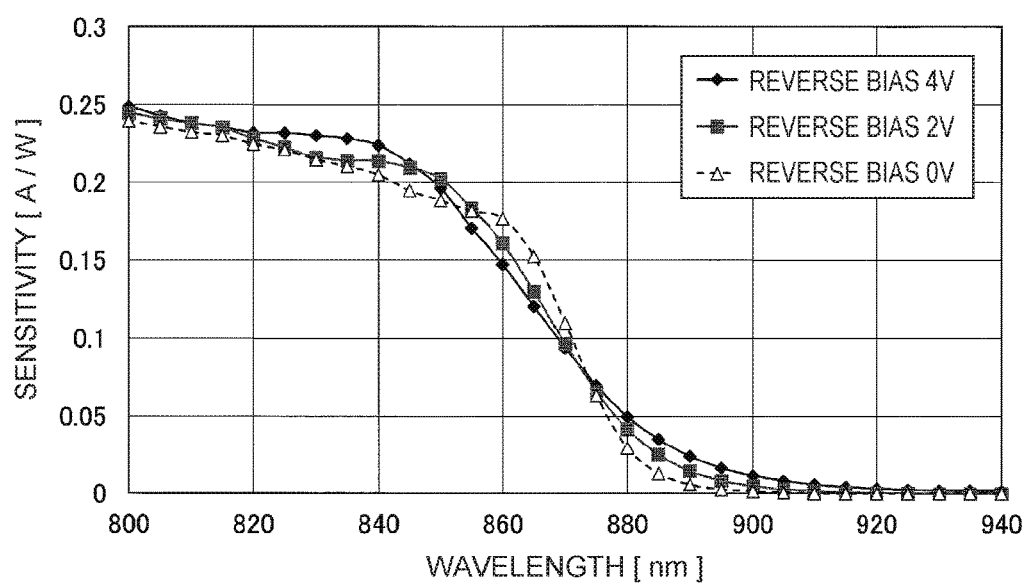
FIG. 9 is a graph illustrating a relationship between a wavelength and sensitivity of light in an i type GaAs layer.

Here, FIG. 9 is a graph illustrating a relationship between a wavelength and sensitivity of light in an i type GaAs layer as a light absorption layer. In a case where light having a light output of 1 W is incident on the i type GaAs layer, the sensitivity on a vertical axis indicates a current amount which is able to be extracted. As the sensitivity increases, a light absorption amount in the i type GaAs layer increases. In this test, a voltage (a reverse bias) which is applied to the i type GaAs layer is changed to 0 V, 2 V, and 4 V.

As illustrated in FIG. 9, the light absorption amount of the i type GaAs layer is changed according to an applied voltage. Therefore, it is found that the light absorption amount of the i type GaAs layer is able to be adjusted according to the applied voltage. This is because an electric field which is applied on the i type GaAs layer is changed according to the applied voltage, and absorption properties vibrate (are changed) by Franz-Keldysh vibration. In the Franz-Keldysh vibration, in a case where a high electric field is applied, an absorption coefficient vibrates on a short wave side shorter than an absorption end wavelength.

Furthermore, even though it is not illustrated, the insulating layer 72 may be provided to surround the heat insulating layer 40 and the first contact layer 50, and the insulating layer 74 may be provided to surround the light absorption layer 52 and the second contact layer 54.

In addition, in the above description, an AlGaAs-based light source has been described, and for example, a GaInP-based semiconductor material, a ZnSSe-based semiconductor material, an InGaN-based semiconductor material, an AlGaN-based semiconductor material, an InGaAs-based semiconductor material, a GaInNAs-based semiconductor material, and a GaAsSb-based semiconductor material may be used as the light source according to the invention according to an oscillation wavelength.

1.3. Manufacturing Method of Light Source

Figure 10:
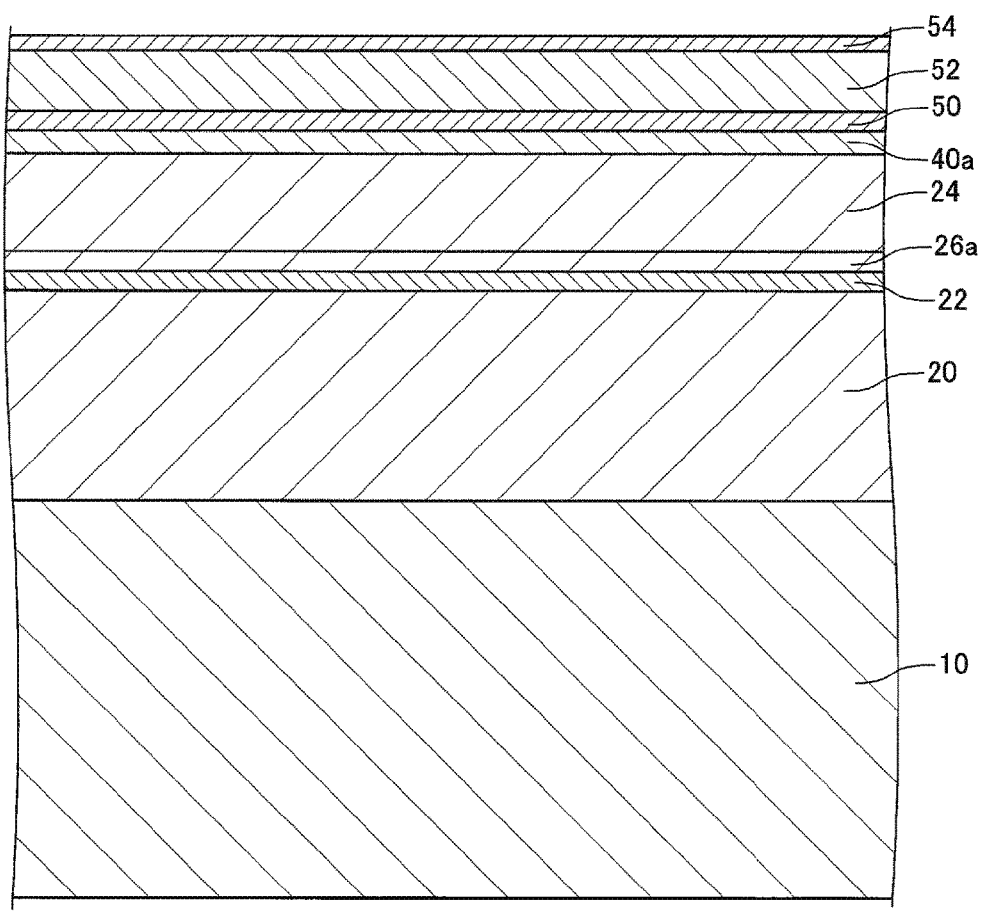
FIG. 10 is a sectional view schematically illustrating a manufacturing step of the light source of the atomic oscillator according to this embodiment.
Figure 11:
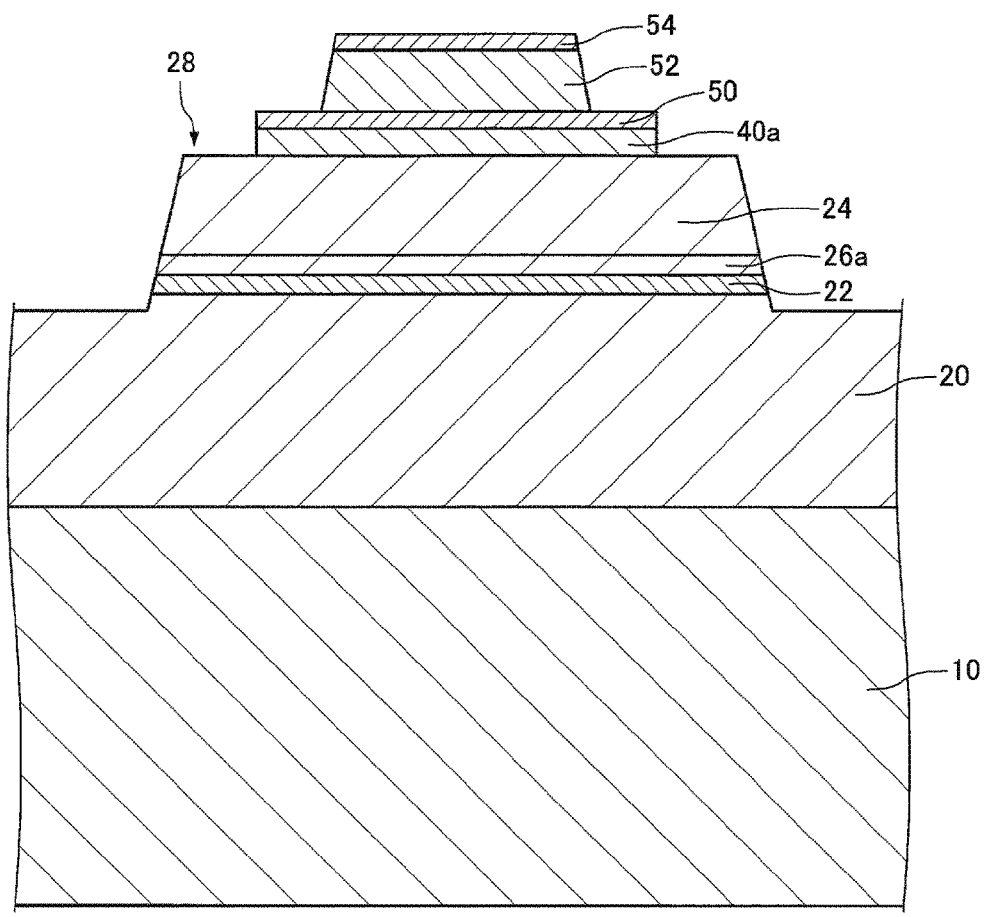
FIG. 11 is a sectional view schematically illustrating the manufacturing step of the light source of the atomic oscillator according to this embodiment.
Figure 12:
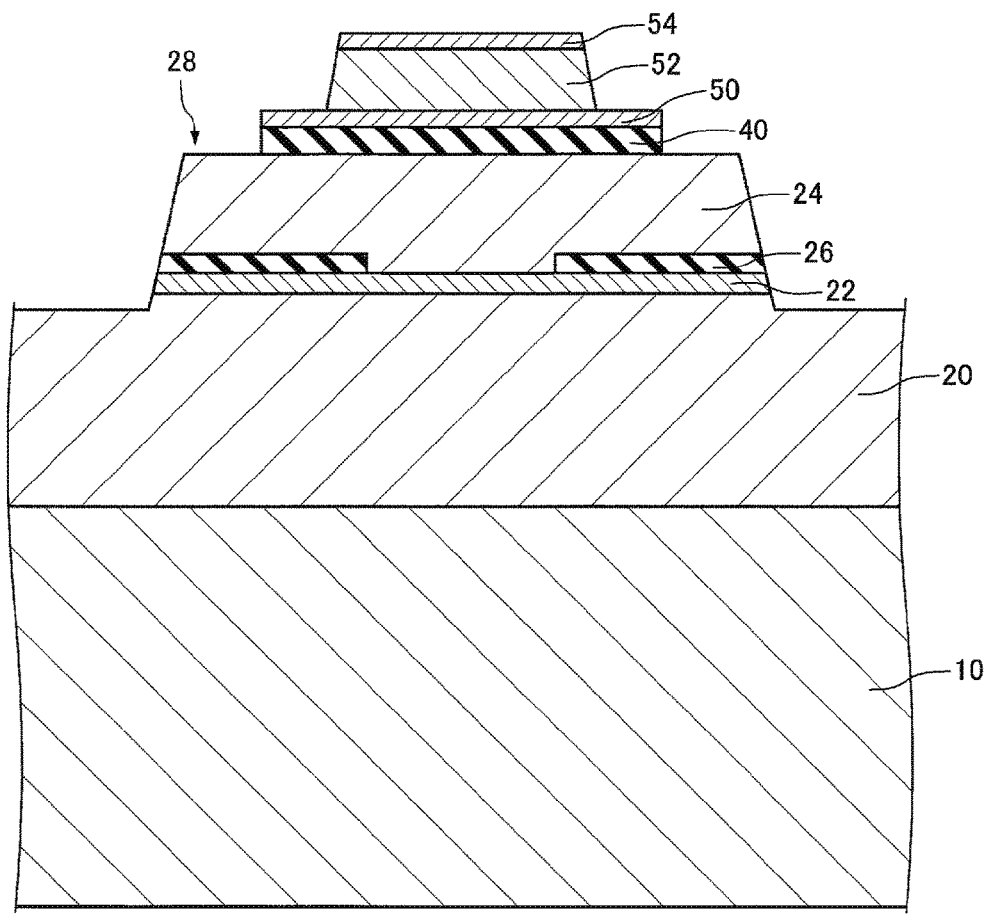
FIG. 12 is a sectional view schematically illustrating the manufacturing step of the light source of the atomic oscillator according to this embodiment.

Next, a manufacturing method of the light source 100 according to this embodiment will be described with reference to the drawings. FIG. 10 to FIG. 12 are sectional views schematically illustrating a manufacturing step of the light source 100 according to this embodiment.

As illustrated in FIG. 10, the first mirror layer 20, the active layer 22, an oxidized layer 26a of which a part becomes the current constriction layer 26 by being oxidized, the second mirror layer 24, an oxidized layer 40a which becomes the heat insulating layer 40 by being oxidized, the first contact layer 50, the light absorption layer 52, and the second contact layer 54 are subjected to epitaxial growth in this order on the substrate 10. Examples of a method of performing the epitaxial growth include a metal organic chemical vapor deposition (MOCVD) method and a molecular beam epitaxy (MBE) method.

As illustrated in FIG. 11, the second contact layer 54, the light absorption layer 52, the first contact layer 50, the oxidized layer 40a, the second mirror layer 24, the oxidized layer 26a, the active layer 22, and the first mirror layer 20 are patterned into a predetermined shape. The patterning, for example, is able to be performed by photolithography and etching. The second contact layer 54 and the light absorption layer 52 may be patterned in the same step (for example, simultaneously). The first contact layer 50 and the oxidized layer 40a may be patterned in the same step. The second mirror layer 24, the oxidized layer 26a, the active layer 22, and the first mirror layer 20 may be patterned in the same step. The sequence for patterning each layer is not particularly limited. It is possible to form the cylindrical portion 28 by this step.

As illustrated in FIG. 12, the current constriction layer 26 is formed by oxidizing a part of the oxidized layer 26a, and the heat insulating layer 40 is formed by oxidizing the oxidized layer 40a. The oxidized layer 26a, for example, is an $Al_xGa_{1-x}As$ ($x \geq 0.95$) layer. The oxidized layer 40a, for example, is an AlAs layer. For example, the oxidized layer 26a and the oxidized layer 40a are oxidized from the side surface by putting the substrate 10 on which each layer is formed into a steam atmosphere of approximately 400° C., and thus, the current constriction layer 26 and the heat insulating layer 40 are formed.

As illustrated in FIG. 5, the insulating layer 70 is formed around the cylindrical portion 28. The insulating layer 70, for example, is formed by a spin coating method or a CVD method, and by patterning. The patterning, for example, is performed by photolithography and etching.

As illustrated in FIG. 6 and FIG. 7, the insulating layers 72 and 74 are formed on the insulating layer 70. The insulating layers 72 and 74, for example, are formed by a spin coating method or a CVD method, and by patterning. The patterning, for example, is performed by photolithography and etching.

As illustrated in FIG. 5, the first electrode 30 is formed under the substrate 10, the second electrode 32 is formed on the second mirror layer 24, the third electrode 60 is formed on the first contact layer 50, and the fourth electrode 62 is formed on the second contact layer 54. The electrodes 30, 32, 60, and 62, for example, are formed by a combination of a vacuum deposition method and a lift-off method, or the like. Furthermore, the sequence for forming the electrodes 30, 32, 60, and 62 is not particularly limited.

The light source 100 is able to be manufactured by the steps described above.

The atomic oscillator 1000, for example, has the following characteristics.

In the atomic oscillator 1000, the light source 100 includes the first mirror layer 20 disposed on the upper portion of the substrate 10, the active layer 22 disposed on the upper portion of the first mirror layer 20, the second mirror layer 24 disposed on the upper portion of the active layer 22, the first contact layer 50 disposed on the upper portion of the second mirror layer 24, the light absorption layer 52 disposed on the upper portion of the first contact layer 50, and the second contact layer 54 disposed on the upper portion of the light absorption layer 52. For this reason, in the atomic oscillator 1000, in a case where the center wavelength of the light exiting from the light source 100 (the light exiting from the upper surface of the second contact layer 54) is changed by changing a current amount injected into the active layer 22, it is possible to return the light output of the light exiting from the light source 100 to a predetermined value by changing the voltage applied to the light absorption layer 52 even in a case where the light output (the light amount) of the light exiting from the light source 100 is shifted from the predetermined value. Thus, in the atomic oscillator 1000, the output wavelength (the center wavelength) and the light output of the light source 100 are able to be independently adjusted (controlled), and control is easily performed.

Further, even in a case where the light source is driven by setting the current amount injected into the active layer to be constant and by setting the driving temperature of the light source to be constant, there is a case in which the output wavelength and the light output of the light source are changed for a long period of time. Even in such a case, in the atomic oscillator 1000, the output wavelength and the light output of the light source 100 are able to be independently adjusted, and long-term stability of the atomic oscillator 1000 is able to be improved.

In the light source 100 of the atomic oscillator 1000, the heat insulating layer 40 having thermal conductivity lower than that of the second mirror layer 24 is provided between the second mirror layer 24 and the first contact layer 50. For this reason, in the atomic oscillator 1000, even in a case where the light absorption layer 52 absorbs light and generates heat, the heat is insulated by the heat insulating layer 40, and thus, it is possible to prevent the heat from reaching the second mirror layer 24 or the active layer 22. Accordingly, in the atomic oscillator 1000, it is possible to suppress a temperature change in the light source 100 due to the heat generated in the light absorption layer 52. Therefore, in the atomic oscillator 1000, it is possible to suppress a variation in the center wavelength according to the temperature of the light source 100, and it is possible to independently adjust the output wavelength and the light output of the light source 100 according to the injection current amount of the active layer 22 and the applied voltage with respect to the light absorption layer 52. In the atomic oscillator 1000, for example, in order to set the center wavelength of the light source 100 to be constant, it is necessary to control the driving temperature of the light source 100 by the unit such as tens of mK, and it is possible to easily control the temperature by providing the heat insulating layer 40.

The atomic oscillator 1000 includes the control unit 120 in which the output and the wavelength (the center wavelength) of the light exiting from the light source 100 are changed by controlling the current injected into the active layer 22, and the light absorption amount in the light absorption layer 52 is changed by controlling the voltage applied to the light absorption layer 52. For this reason, in the atomic oscillator 1000, the output wavelength and the light output of the light source 100 are able to be independently controlled by the control unit 120.

In the atomic oscillator 1000, the control unit 120 controls the voltage applied to the light absorption layer 52 such that the output of the light exiting from the light source 100 becomes constant. For this reason, the control unit 120, for example, is able to change the light absorption amount in the light absorption layer 52, and is able to set the output of the light exiting from the light source 100 to be constant. Accordingly, for example, it is possible to improve frequency stability of the atomic oscillator 1000 (the light source 100). There is a case where a variation in the light output causes a frequency variation in the light source 100 to occur.

2. Modification Example of Atomic Oscillator 2.1. First Modification Example

Figure 13:
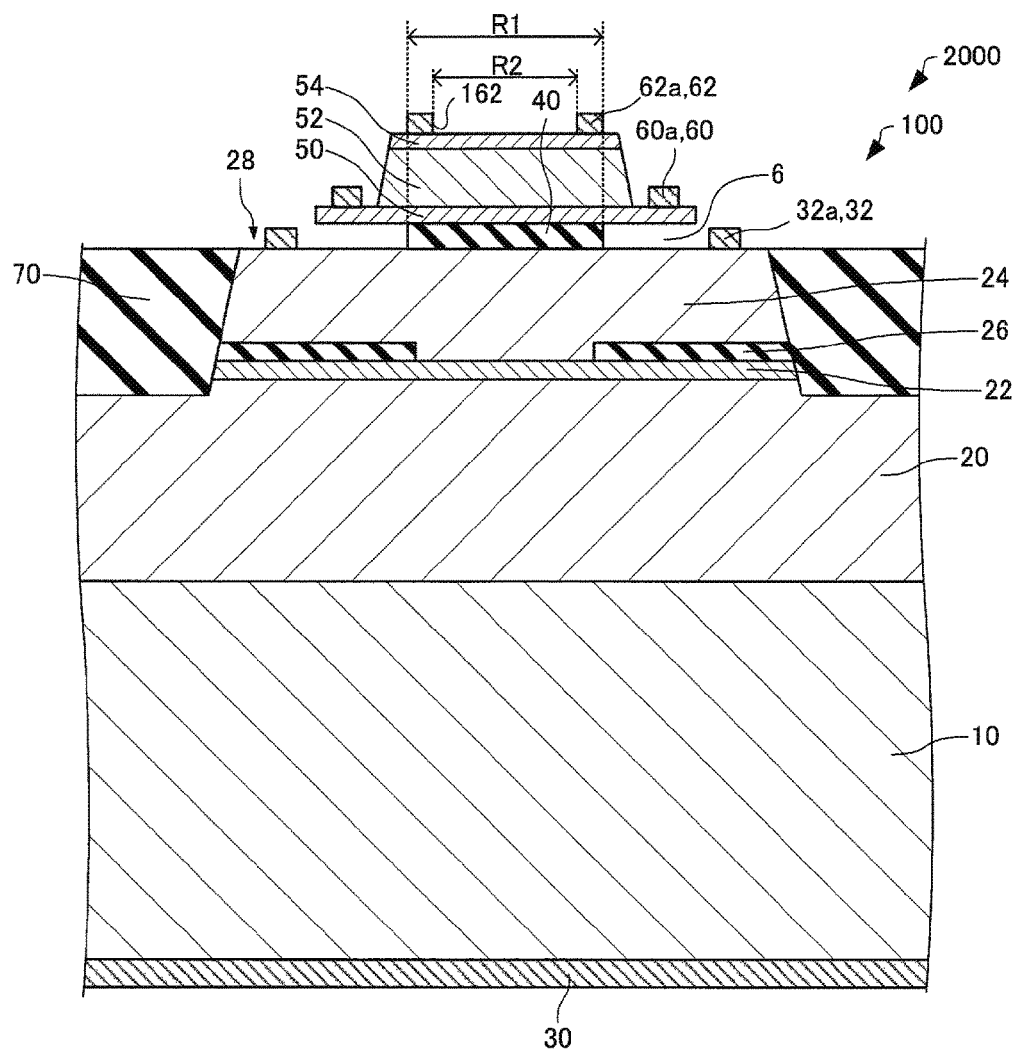
FIG. 13 is a sectional view schematically illustrating a light source of an atomic oscillator according to a first modification example of this embodiment.
Figure 14:
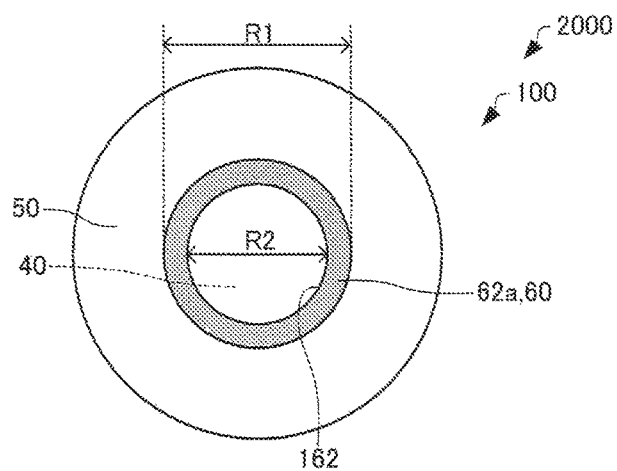
FIG. 14 is a plan view schematically illustrating the light source of the atomic oscillator according to the first modification example of this embodiment.

Next, an atomic oscillator according to a first modification example of this embodiment will be described with reference to the drawings. FIG. 13 is a sectional view schematically illustrating a light source 100 of an atomic oscillator 2000 according to the first modification example of this embodiment. FIG. 14 is a plan view schematically illustrating the light source 100 of the atomic oscillator 2000 according to the first modification example of this embodiment. Furthermore, for the sake of convenience, in FIG. 14, members other than the contact portion 62a of the fourth electrode 62, the first contact layer 50, and the heat insulating layer 40 are not illustrated.

Hereinafter, in the atomic oscillator 2000 according to the first modification example of this embodiment, the same reference numerals are applied to members having the same functions as those of the constituent members of the atomic oscillator 1000 according to this embodiment, and the detailed description thereof will be omitted. The same applies to an atomic oscillator according to a second modification example of this embodiment described below.

As illustrated in FIG. 5, in the light source 100 of the atomic oscillator 1000, the area of the heat insulating layer 40 is identical to the area of the first contact layer 50, in plan view.

In contrast, as illustrated in FIG. 13 and FIG. 14, in the light source 100 of the atomic oscillator 2000, the area of the heat insulating layer 40 is smaller than the area of the first contact layer 50, in plan view. The heat insulating layer 40 is provided on the inside of the outer circumference of the first contact layer 50, in plan view. A space 6 is provided between the second mirror layer 24 and the first contact layer 50. In the illustrated example, a diameter R1 of the heat insulating layer 40 has the same size as that of an outer diameter of the contact portion 62a of the fourth electrode 62, and the diameter R1 is larger than an inner diameter R2 of the contact portion 62a, in plan view. In plan view, the area of the heat insulating layer 40 is greater than an area of an opening portion 162 which is defined by the contact portion 62a, and the opening portion 162 is provided on the inside of the outer circumference of the heat insulating layer 40. Further, in the illustrated example, the diameter R1 of the heat insulating layer 40 is larger than an inner diameter of an opening portion which is provided on the current constriction layer 26, in plan view.

The heat insulating layer 40, for example, is selectively etched by hydrogen fluoride (HF), and thus, the diameter R1 is able to be adjusted. Furthermore, when the heat insulating layer 40 is etched by the hydrogen fluoride, the current constriction layer 26 is protected by a resist or the like.

In the light source 100 of the atomic oscillator 2000, the area of the heat insulating layer 40 is smaller than the area of the first contact layer 50, in plan view. For this reason, in the atomic oscillator 2000, the space 6 is provided between the second mirror layer 24 and the first contact layer 50. Accordingly, in the atomic oscillator 2000, even in a case where the light absorption layer 52 absorbs light and generates heat, the heat is insulated by the heat insulating layer 40 and the space 6, and thus, it is possible to prevent the heat from reaching the second mirror layer 24 or the active layer 22.

In the light source 100 of the atomic oscillator 2000, the area of the heat insulating layer 40 is larger than the area of the opening portion 162 which is defined by the contact portion 62a, and the opening portion 162 is provided on the inside of the outer circumference of the heat insulating layer 40, in plan view. For this reason, in the atomic oscillator 2000, the light exiting from the upper surface of the second contact layer 54, which is generated in the active layer 22, is able to be prevented from being transmitted through a boundary between the heat insulating layer 40 and the space 6. Accordingly, in the atomic oscillator 2000, it is possible to suppress scattering or loss of the light on the boundary between the heat insulating layer 40 and the space 6.

Figure 15:
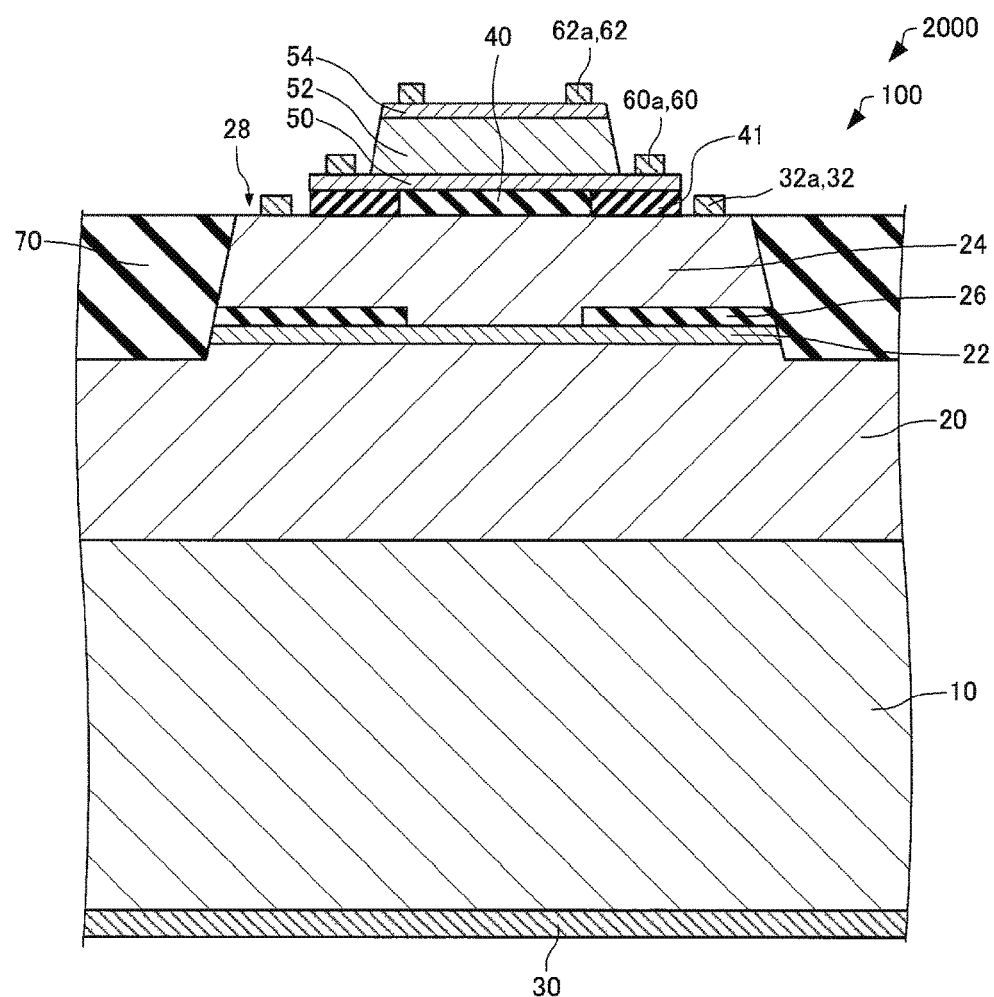
FIG. 15 is a sectional view schematically illustrating the light source of the atomic oscillator according to the first modification example of this embodiment.

Furthermore, as illustrated in FIG. 15, a low thermal conductive layer 41 having thermal conductivity lower than that of the heat insulating layer may be provided around the heat insulating layer 40. The low thermal conductive layer 41 is provided between the second mirror layer 24 and the first contact layer 50. The low thermal conductive layer 41, for example, is a polyimide layer. For example, thermal conductivity of the polyimide is 0.018 W/(cm·K). The low thermal conductive layer 41, for example, is formed by a CVD method and a spin coating method. By providing the low thermal conductive layer 41, it is possible to improve impact resistance, compared to a case where the space 6 is provided between the second mirror layer 24 and the first contact layer 50 (a case illustrated in FIG. 13). Further, even in a case where the light absorption layer 52 absorbs light and generates heat, the heat is insulated by the heat insulating layer 40 and the low thermal conductive layer 41, and thus, it is possible to prevent the heat from reaching the second mirror layer 24 or the active layer 22.

2.2. Second Modification Example

Figure 16:
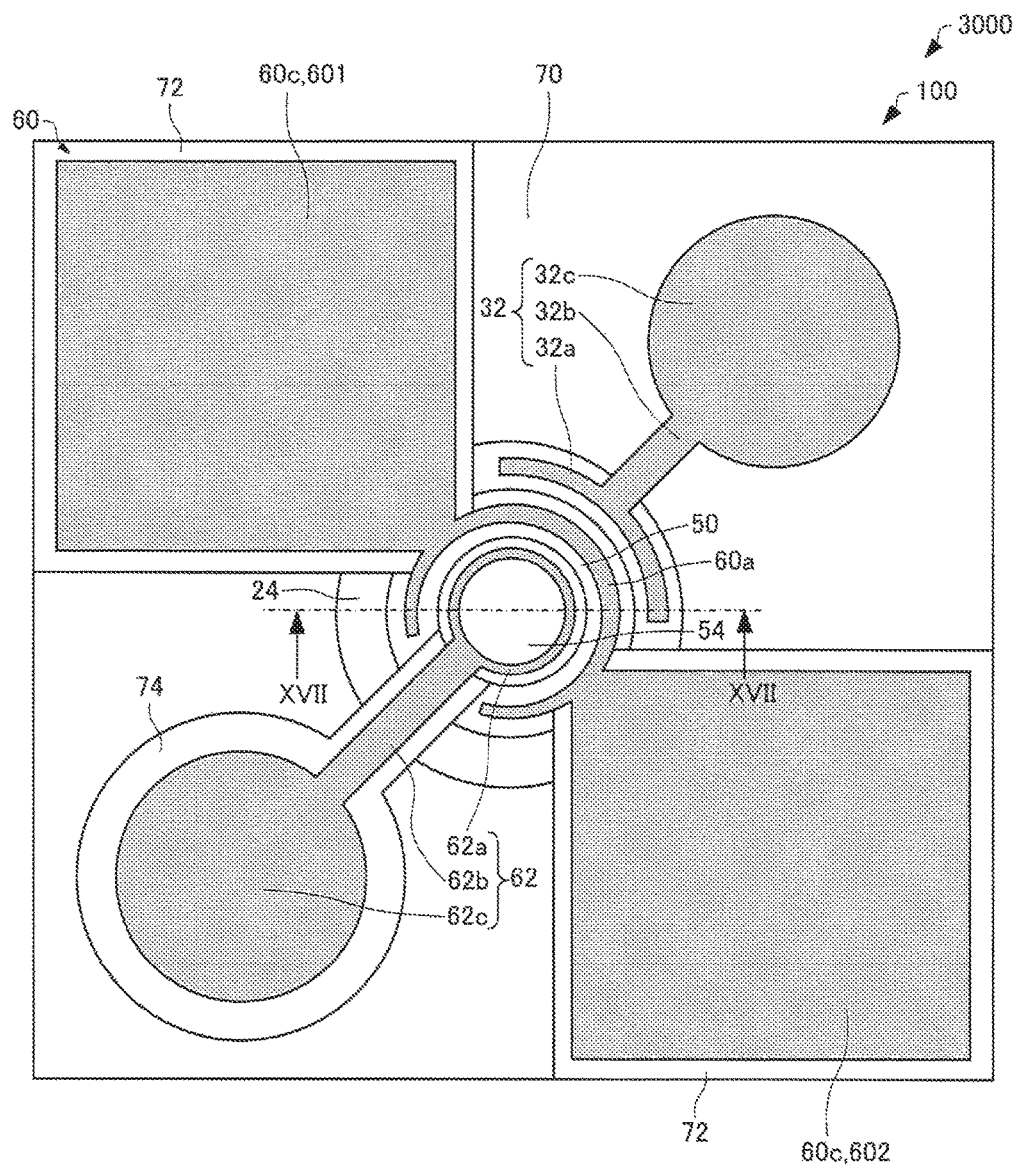
FIG. 16 is a plan view schematically illustrating a light source of an atomic oscillator according to a second modification example of this embodiment.
Figure 17:
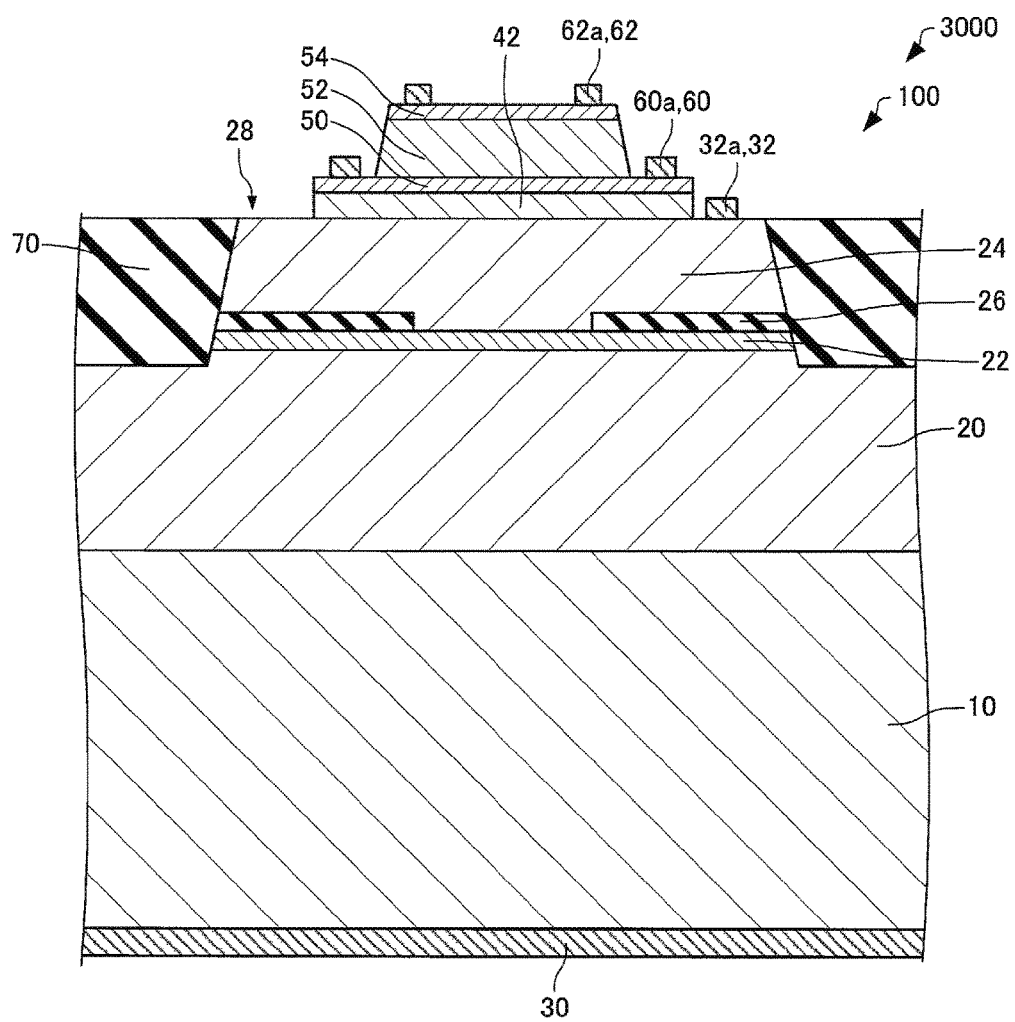
FIG. 17 is a sectional view schematically illustrating the light source of the atomic oscillator according to the second modification example of this embodiment.

Next, an atomic oscillator according to a second modification example of this embodiment will be described with reference to the drawings. FIG. 16 is a plan view schematically illustrating a light source 100 of an atomic oscillator 3000 according to the second modification example of this embodiment. FIG. 17 is a sectional view of line XVII-XVII of FIG. 16 schematically illustrating the light source 100 of the atomic oscillator 3000 according to the second modification example of this embodiment.

As illustrated in FIG. 5, in the light source 100 of the atomic oscillator 1000, the heat insulating layer 40 having thermal conductivity lower than that of the second mirror layer 24 is provided between the second mirror layer 24 and the first contact layer 50.

In contrast, as illustrated in FIG. 17, in the light source 100 of the atomic oscillator 3000, a heat diffusion layer 42 having thermal conductivity higher than that of the second mirror layer 24 is provided between the second mirror layer 24 and the first contact layer 50. The thermal conductivity of the heat diffusion layer 42 is higher than the thermal conductivity of the high refractive index layer configuring the second mirror layer 24, and is higher than the thermal conductivity of the low refractive index layer configuring the second mirror layer 24. The heat diffusion layer 42, for example, is an i type AlAs layer and an i type GaAs layer. For example, thermal conductivity of i type GaAs is 0.55 W/(cm·K).

In the illustrated example, the planar shape of the heat diffusion layer 42 is a circular shape. In plan view, an area of the heat diffusion layer 42 is smaller than the area of the upper surface of the second mirror layer 24, and the heat diffusion layer 42 is provided on the inside of the outer circumference of the second mirror layer 24. In plan view, the area of the heat diffusion layer 42 and the area of the first contact layer 50, for example, are identical to each other.

The heat diffusion layer 42, for example, is formed by an MOCVD method and an MBE method. In a step of forming the current constriction layer 26, the side surface of the heat diffusion layer 42 is covered with a resist or the like such that the heat diffusion layer 42 is not oxidized.

As illustrated in FIG. 16, in the light source 100 of the atomic oscillator 3000, the third electrode 60 includes the contact portion 60a and the pad portion 60c connected to the contact portion 60a. The pad portion 60c includes a first portion 601 and a second portion 602. In plan view, an area of the first portion 601 is larger than an area of the pad portion 32c and an area of the pad portion 62c. In plan view, an area of the second portion 602 is larger than the area of the pad portion 32c and the area of the pad portion 62c. In the illustrated example, the planar shape of the first portion 601 and the second portion 602 are approximately a quadrangular shape. In plan view, the first portion 601 and the second portion 602 may be point-symmetrically provided with respect to the center of the second contact layer 54.

In the light source 100 of the atomic oscillator 3000, the heat diffusion layer 42 having thermal conductivity higher than that of the second mirror layer 24 is provided between the second mirror layer 24 and the first contact layer 50. For this reason, in the atomic oscillator 3000, even in a case where the light absorption layer 52 absorbs light and generates heat, the heat is able to be diffused to the outside through the heat diffusion layer 42, and thus, it is possible to prevent the heat from reaching the second mirror layer 24 or the active layer 22. Specifically, the heat generated in the light absorption layer 52 is emitted to the outside through the first contact layer 50, the heat diffusion layer 42, the contact portion 60a, and the pad portion 60c.

In the light source 100 of the atomic oscillator 3000, the pad portion 60c of the third electrode 60 includes the first portion 601 and the second portion 602, and in plan view, the area of the first portion 601 is larger than the area of the pad portions 32c and 62c, and the area of the second portion 602 is larger than the area of the pad portions 32c and 62c. For this reason, in the atomic oscillator 3000, for example, the light generated in the light absorption layer 52 is able to be efficiently emitted to the outside from the pad portion 60c, compared to a case where the area of the pad portion 60c is identical to the area of the pad portions 32c and 62c.

Furthermore, even though it is not illustrated, the heat diffusion layer 42 may be provided in the light source 100 of the atomic oscillator 1000. That is, the heat diffusion layer 42 may be provided between the heat insulating layer 40 and the first contact layer 50. Similarly, the heat diffusion layer 42 may be provided in the light source 100 of the atomic oscillator 2000. By providing the heat insulating layer 40 and the heat diffusion layer 42, it is possible to more reliably prevent the light generated in the light absorption layer 52 from reaching the second mirror layer 24 or the active layer 22.

In the invention, a part of the configuration may be omitted, or each of the embodiments or the modification examples may be combined in a range having the characteristic and effects described herein.

The invention has a configuration (for example, a configuration having the same function, the same method, and the same result or a configuration having the same object and the same effect) which is substantially identical to the configuration described the embodiments. In addition, the invention has a configuration in which a portion of the configuration described in the embodiments, which is not essential, is substituted. In addition, the invention has a configuration in which the same function effect as that of the configuration described in the embodiments is able to be obtained or a configuration in which the same object as that of the configuration described in the embodiments is able to be attained. In addition, the invention has a configuration in which a known technology is added to the configuration described in the embodiments.

The entire disclosure of Japanese Patent Application No. 2015-210822, filed Oct. 27, 2015 is expressly incorporated by reference herein.

What is claimed is:

1. An atomic oscillator, comprising:
   a gas cell sealing alkali metal atoms;
   a light source emitting light to the gas cell; and
   a light detection unit detecting a light amount of light transmitted through the gas cell,
   wherein the light source includes
      a substrate,
      a first mirror layer disposed on an upper portion of the substrate,
      an active layer disposed on an upper portion of the first mirror layer,
      a second mirror layer disposed on an upper portion of the active layer,
      a first contact layer disposed on an upper portion of the second mirror layer,
      a light absorption layer disposed on an upper portion of the first contact layer, and
      a second contact layer disposed on an upper portion of the light absorption layer.

2. The atomic oscillator according to claim 1,
   wherein a heat insulating layer having thermal conductivity lower than that of the second mirror layer is provided between the second mirror layer and the first contact layer.

3. The atomic oscillator according to claim 2,
   wherein an area of the heat insulating layer is smaller than an area of the first contact layer in a plan view.

4. The atomic oscillator according to claim 3,
   wherein a layer having thermal conductivity lower than that of the heat insulating layer is provided around the heat insulating layer.

5. The atomic oscillator according to claim 1,
   wherein a heat diffusion layer having thermal conductivity higher than that of the second mirror layer is provided between the second mirror layer and the first contact layer.

6. The atomic oscillator according to claim 1, further comprising:
   a control unit changing an output and a wavelength of light exiting from the light source by controlling a current injected into the active layer and changing a light absorption amount in the light absorption layer by controlling a voltage applied to the light absorption layer.

7. The atomic oscillator according to claim 6,
   wherein the control unit controls the voltage applied to the light absorption layer such that the output of the light exiting from the light source becomes constant.

* * * * *